United States Patent
Yamamoto

(10) Patent No.: US 12,494,742 B2
(45) Date of Patent: Dec. 9, 2025

(54) CIRCUIT DEVICE AND OSCILLATOR

(71) Applicant: SEIKO EPSON CORPORATION, Tokyo (JP)

(72) Inventor: Takehiro Yamamoto, Matsumoto (JP)

(73) Assignee: SEIKO EPSON CORPORATION (JP)

( * ) Notice: Subject to any disclaimer, the term of this patent is extended or adjusted under 35 U.S.C. 154(b) by 0 days.

(21) Appl. No.: 18/602,077

(22) Filed: Mar. 12, 2024

(65) Prior Publication Data
US 2024/0313704 A1  Sep. 19, 2024

(30) Foreign Application Priority Data

Mar. 13, 2023  (JP) .................. 2023-038512

(51) Int. Cl.
*H03B 5/36* (2006.01)

(52) U.S. Cl.
CPC ....... *H03B 5/36* (2013.01); *H03B 2200/0088* (2013.01)

(58) Field of Classification Search
CPC ..... H03B 5/36; H03B 2200/0088; H03K 5/04
USPC ........... 331/158, 74, 116 FE, 117 FE
See application file for complete search history.

(56) References Cited

U.S. PATENT DOCUMENTS

| | | | |
|---|---|---|---|
| 2005/0073371 A1* | 4/2005 | Brett | H03L 7/099 331/74 |
| 2023/0208358 A1* | 6/2023 | Beppu | H03H 9/1021 331/66 |

FOREIGN PATENT DOCUMENTS

JP  H05-252007 A  9/1993

* cited by examiner

*Primary Examiner* — Arnold M Kinkead
(74) *Attorney, Agent, or Firm* — Harness, Dickey & Pierce, P.L.C.

(57) ABSTRACT

Provided is a circuit device including: an oscillation circuit configured to generate an oscillation signal; a waveform shaping circuit configured to shape the oscillation signal into a clock signal having a rectangular wave; a low-pass filter configured to smooth the clock signal and generate a detection voltage corresponding to a duty of the clock signal; and a differential amplifier configured to output a bias voltage based on a difference between the detection voltage and a reference voltage to an input node of the waveform shaping circuit, in which a unity gain frequency of the differential amplifier is lower than a cutoff frequency of the low-pass filter.

8 Claims, 6 Drawing Sheets

CIRCUIT DEVICE AND OSCILLATOR

The present application is based on, and claims priority from JP Application Serial Number 2023-038512, filed Mar. 13, 2023, the disclosure of which is hereby incorporated by reference herein in its entirety.

BACKGROUND

1. Technical Field

The present disclosure relates to a circuit device and an oscillator.

2. Related Art

In the related art, a technique for adjusting a duty ratio of a clock signal is known. For example, in JP-A-5-252007, rising and falling of an input clock are smoothed by a low-pass filter, and the clock signal is inverted by an inverter to form an inverted clock. Further, a DC level of the inverted clock is supplied to a +input of an operational amplifier. Further, the inverted clock is inverted by the inverter, and the integrated DC level is supplied to a −input of the operational amplifier. The operational amplifier adds these difference values to the clock signal described above to perform bias correction, and supplies the corrected signal to the inverter. As a result, a logical value determination timing is corrected, and the duty ratio is adjusted.

JP-A-5-252007 is an example of the related art.

SUMMARY

In the related art, the low-pass filter that smooths the rising and the falling of the input clock is used. However, the low-pass filter may increase thermal noise (noise floor).

A circuit device for solving the problems described above includes: an oscillation circuit configured to generate an oscillation signal; a waveform shaping circuit configured to shape the oscillation signal into a clock signal having a rectangular wave; a low-pass filter configured to smooth the clock signal and generate a detection voltage corresponding to a duty of the clock signal; and a differential amplifier configured to output a bias voltage based on a difference between the detection voltage and a reference voltage to an input node of the waveform shaping circuit, in which a unity gain frequency of the differential amplifier is lower than a cutoff frequency of the low-pass filter.

DESCRIPTION OF EMBODIMENTS

Hereinafter, preferred embodiments of the present disclosure will be described in detail with reference to the drawings. The embodiments described below are examples of the present disclosure described in the claims, and the disclosed embodiments are not limited to the embodiments shown below. Further, not all configurations described below are essential configuration requirements of the present disclosure.

1. First Embodiment

1-1. Configuration of Oscillator

Figure 1:
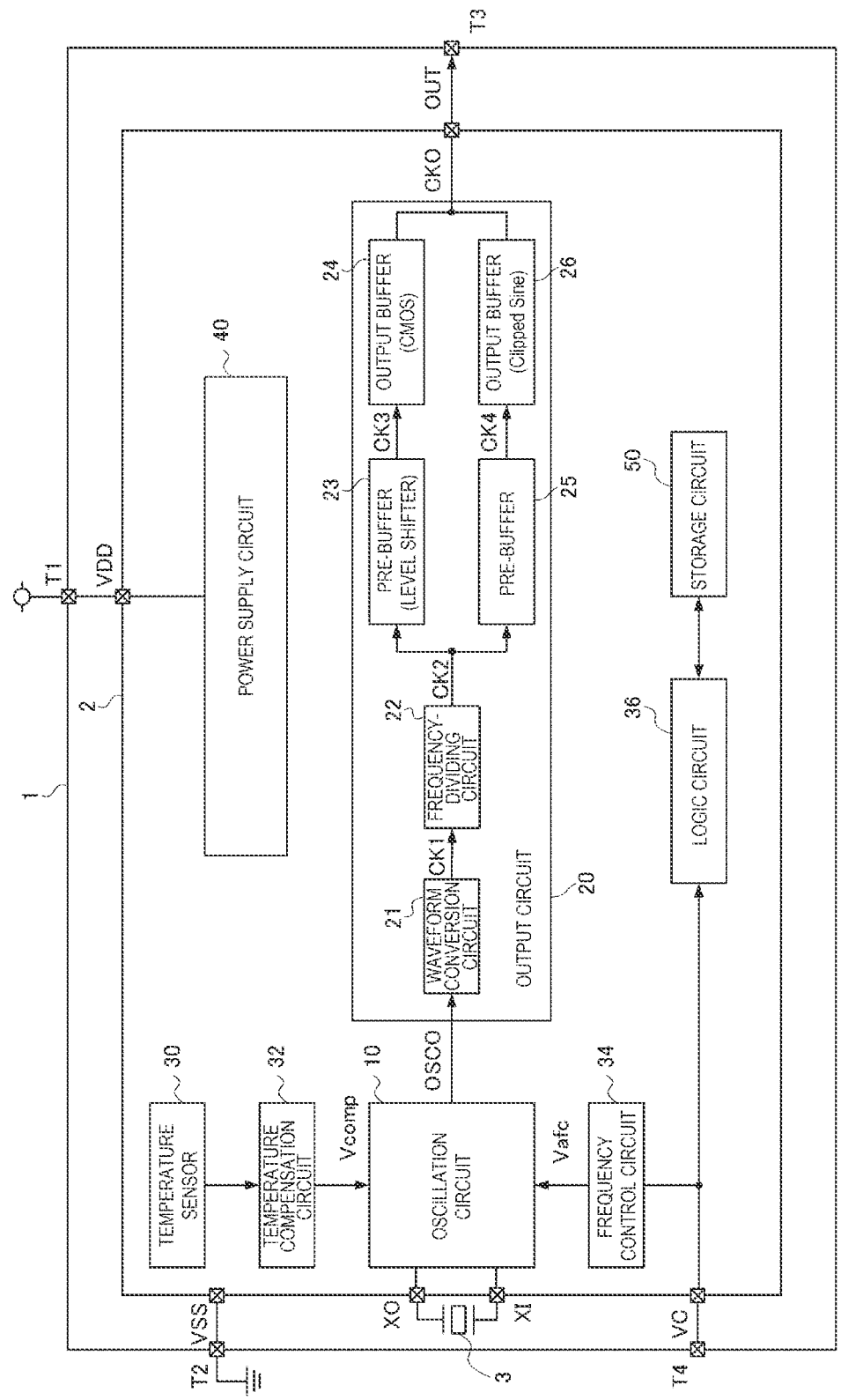
FIG. 1 is a functional block diagram of an oscillator according to a first embodiment.

FIG. 1 is a functional block diagram of an oscillator 1 according to a first embodiment. The oscillator 1 according to the embodiment includes a circuit device 2 and a resonator 3, and includes a package and a lid (not shown). The circuit device 2 and the resonator 3 are housed in a space formed by the package and the lid. The resonator 3 in the embodiment is a quartz crystal resonator using quartz crystal as a substrate material, and is, for example, an AT cut quartz crystal resonator or a tuning fork type quartz crystal resonator. The resonator 3 may be a surface acoustic wave (SAW) resonator or a micro electro mechanical systems (MEMS) resonator. Further, as the substrate material of the resonator 3, in addition to the quartz crystal, piezoelectric single crystals such as lithium tantalate and lithium niobate, piezoelectric materials such as piezoelectric such as lead zirconate titanate, silicon semiconductor materials, or the like can be used. As an excitation method of the resonator 3, one based on piezoelectric effects may be used, or electrostatic drive using Coulomb force may be used. Further, in the embodiment, the circuit device 2 is implemented by a one-chip integrated circuit (IC). At least a part of the circuit device 2 may be implemented by discrete components.

The circuit device 2 includes a VDD terminal, a VSS terminal, an OUT terminal, a VC terminal, an XI terminal, and an XO terminal as external coupling terminals. The VDD terminal, the VSS terminal, the OUT terminal, and the VC terminal are electrically coupled to a T1 terminal, a T2 terminal, a T3 terminal, and a T4 terminal that are a plurality of external terminals of the oscillator 1 shown in FIG. 2, respectively. The XI terminal is electrically coupled to one end of the resonator 3, and the XO terminal is electrically coupled to the other end of the resonator 3.

In the embodiment, the circuit device 2 includes an oscillation circuit 10, an output circuit 20, a temperature sensor 30, a temperature compensation circuit 32, a frequency control circuit 34, a logic circuit 36, a power supply circuit 40, and a storage circuit 50. The circuit device 2 may have a configuration obtained by omitting or changing some of the elements, or adding other elements.

The power supply circuit 40 includes a regulator that generates various constant voltages based on a power supply voltage supplied from outside via the T1 terminal and the VDD terminal. The various constant voltages are supplied to the circuits.

The oscillation circuit 10 is electrically coupled to the XI terminal and the XO terminal, and causes the resonator 3 to oscillate to generate an oscillation signal OSCO. Specifically, the oscillation circuit 10 is a circuit that causes the resonator 3 to oscillate by amplifying an output signal of the resonator 3 and feeding back the amplified output signal to the resonator 3.

The temperature sensor 30 is a sensor that detects a temperature of the circuit device 2 and outputs a temperature signal of a voltage corresponding to the temperature, and is implemented by, for example, a circuit that uses temperature characteristics of a bandgap reference circuit.

The temperature compensation circuit 32 generates a temperature compensation voltage Vcomp for correcting frequency-temperature characteristics of the oscillation signal OSCO output from the oscillation circuit 10 based on the temperature signal output from the temperature sensor 30 and temperature compensation data corresponding to the frequency-temperature characteristics of the resonator 3, and supplies the generated temperature compensation voltage Vcomp to the oscillation circuit 10. The temperature compensation data is supplied from the logic circuit 36 to the temperature compensation circuit 32.

A frequency control signal input from the T4 terminal is supplied to the frequency control circuit 34 via the VC terminal. The frequency control circuit 34 generates a frequency control voltage Vafc for controlling an oscillation frequency of the oscillation circuit 10 according to a voltage level of the frequency control signal, and supplies the generated frequency control voltage Vafc to the oscillation circuit 10.

Due to the temperature compensation voltage Vcomp, the oscillation signal OSCO output by the oscillation circuit 10 has a substantially constant frequency corresponding to the frequency control voltage Vafc at any temperature within a predetermined temperature range. The oscillation signal OSCO is input to the output circuit 20.

In the embodiment, the output circuit 20 includes a waveform conversion circuit 21, a frequency-dividing circuit 22, a pre-buffer 23, an output buffer 24, a pre-buffer 25, and an output buffer 26. The waveform conversion circuit 21 generates and outputs a clock signal CK1 having a rectangular wave based on the oscillation signal OSCO output from the oscillation circuit 10.

The frequency-dividing circuit 22 outputs a clock signal CK2 obtained by frequency-dividing the clock signal CK1 output from the waveform conversion circuit 21 by a frequency-dividing ratio corresponding to frequency-dividing ratio data. The frequency-dividing ratio data is supplied from the logic circuit 36 to the frequency-dividing circuit 22. When the frequency-dividing ratio is 1, the frequency-dividing circuit 22 outputs the clock signal CK2 obtained by buffering the clock signal CK1 output from the waveform conversion circuit 21. The clock signal CK2 output from the frequency-dividing circuit 22 is commonly input to the pre-buffer 23 and the pre-buffer 25.

The pre-buffer 23 outputs a clock signal CK3 obtained by buffering the clock signal CK2 output from the frequency-dividing circuit 22. The pre-buffer 23 also functions as a level shifter that outputs the clock signal CK3 at a voltage level matched with an input voltage level of the output buffer 24. The output buffer 24 outputs a clock signal having metal oxide a complementary semiconductor (CMOS) output waveform by buffering the clock signal CK3 output from the pre-buffer 23.

The pre-buffer 25 outputs a clock signal CK4 obtained by buffering the clock signal CK2 output from the frequency-dividing circuit 22. The output buffer 26 converts the clock signal CK4 output from the pre-buffer 25 into a clock signal having a clipped sine waveform and outputs the converted clock signal.

In the embodiment, an output node of the output buffer 24 and an output node of the output buffer 26 are electrically coupled to the OUT terminal via a switch circuit (not shown). The logic circuit 36 controls these switches, and electrically couples any one of the output node of the output buffer 24 and the output node of the output buffer 26 to the OUT terminal.

In a state where only the output node of the output buffer 24 is electrically coupled to the OUT terminal, the clock signal having the CMOS output waveform output from the output buffer 24 is output to outside of the oscillator 1 as a clock signal CKO via the OUT terminal and the T3 terminal. Further, in a state where only the output node of the output buffer 26 is electrically coupled to the OUT terminal, the clock signal having the clipped sine waveform output from the output buffer 26 is output to the outside of the oscillator 1 as the clock signal CKO via the OUT terminal and the T3 terminal.

The logic circuit 36 controls an operation of each circuit. Further, the logic circuit 36 can set a mode of the oscillator 1 or the circuit device 2 to various operation modes based on a control signal input to a terminal of the circuit device 2. The operation modes include a normal mode and operation an external communication mode. In the external communication mode, the logic circuit 36 can communicate with an external device via the T4 terminal, and write various pieces of data acquired by the communication into the storage circuit 50. The communication may be performed according to various standards, and for example, standards such as an inter-integrated circuit (I2C) and a serial peripheral interface (SPI) can be used.

In the normal operation mode, the logic circuit 36 controls a switch (not shown), and outputs an output signal of any one of outputs of the output buffers 24 and 26 as the clock signal CKO from the OUT terminal. As a result, the clock signal CKO is output from the T3 terminal of the oscillator 1.

The storage circuit 50 is a circuit that stores various pieces of information, and can include, for example, a register, a nonvolatile memory, and the like. The nonvolatile memory can be implemented by, for example, a metal oxide nitride oxide silicon (MONOS) type memory or an electrically erasable programmable read-only memory (EEPROM). In a manufacturing step of the oscillator 1, various pieces of information such as the temperature compensation data, frequency-dividing ratio data, and control data of a switch that selects an output are stored in the nonvolatile memory. When the oscillator 1 is powered on, the various pieces of information stored in the nonvolatile memory are transferred to the register, and the various pieces of information stored in the register are supplied to the circuits via the logic circuit 36.

1-2. Configuration of Waveform Conversion Circuit

Figure 2:
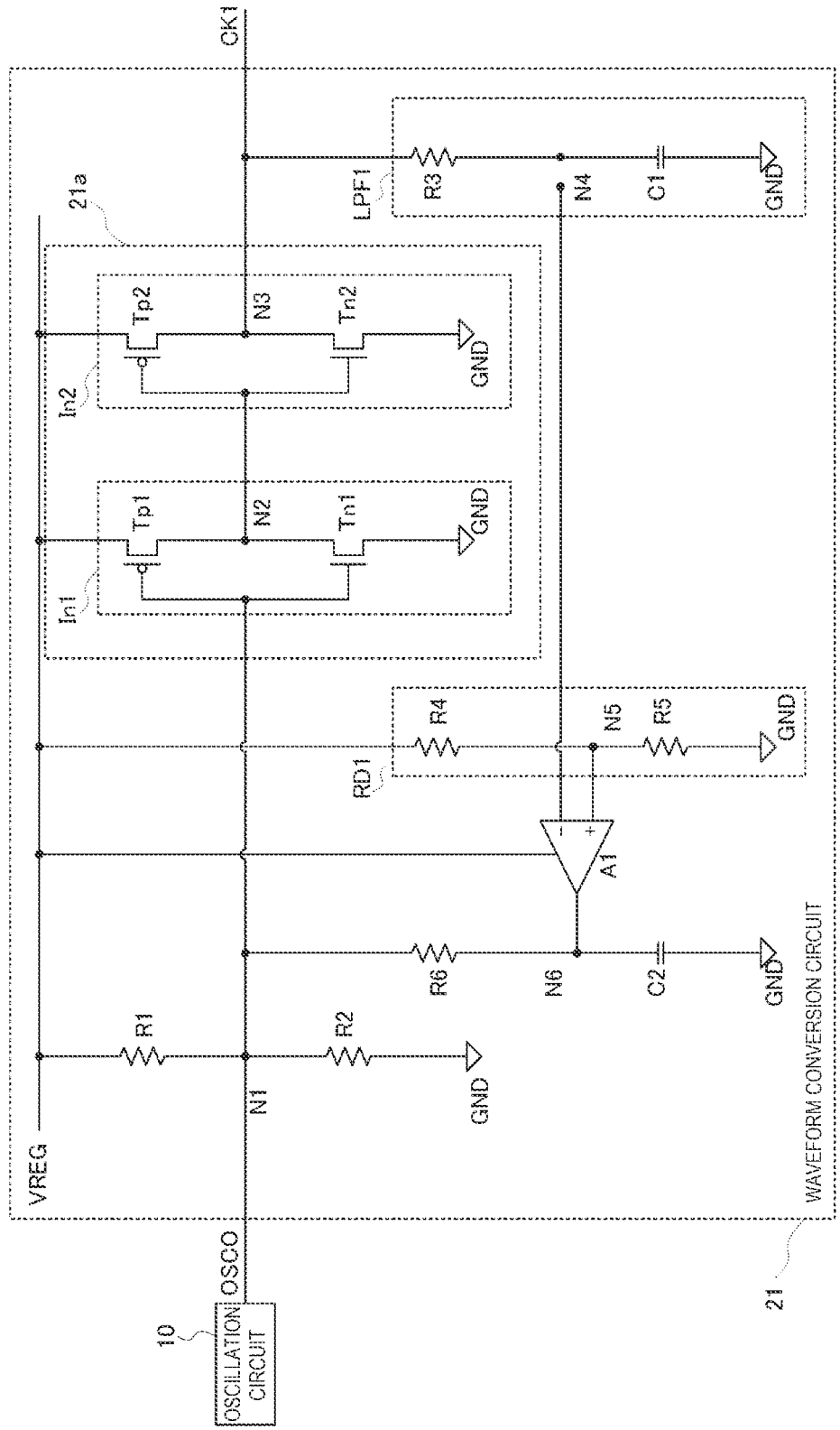
FIG. 2 is a circuit diagram of a waveform conversion circuit.

The oscillator 1 as described above shapes an oscillation signal having a sine wave shape output from the oscillation circuit 10 into a rectangular wave by a waveform shaping circuit 21a provided in the waveform conversion circuit 21. The oscillator 1 generates and outputs the clock signal CKO based on the shaped rectangular wave. FIG. 2 is a circuit diagram of the waveform conversion circuit 21 according to the embodiment. The waveform conversion circuit 21 shown in FIG. 2 includes resistance elements R1 to R6, P-type transistors Tp1 and Tp2, N-type transistors Tn1 and Tn2, capacitive elements C1 and C2, a differential amplifier A1, and the waveform shaping circuit 21a. The waveform shaping circuit 21a includes a first inverter In1 and a second inverter In2.

The waveform conversion circuit 21 includes a power supply node VREG to which a regulator voltage generated by the power supply circuit 40 is supplied. Between the power supply node VREG and a low-potential node GND, the resistance elements R1 and R2 are coupled in series so as to be arranged from the power supply node VREG toward the low-potential node GND. A node N1 between the resistance elements R1 and R2 is electrically coupled to an output of the oscillation circuit 10. In the embodiment, resistance values of the resistance elements R1 and R2 are the same, and a low-potential node is ground. Therefore, the resistance elements R1 and R2 function as a resistance voltage-dividing circuit that biases a voltage of the node N1 to ½ of a voltage of the power supply node VREG.

Further, between the power supply node VREG and the low-potential node GND, the P-type transistor Tp1 and the N-type transistor Tn1 are coupled in series so as to be arranged from the power supply node VREG toward the low-potential node GND, thereby constituting the first inverter In1. That is, a source of the P-type transistor Tp1 is coupled to the power supply node VREG, and a drain thereof is coupled to a drain of the N-type transistor Tn1. A node to which the drain of the P-type transistor Tp1 and the drain of the N-type transistor Tn1 are coupled is referred to as a node N2. A source of the N-type transistor Tn1 is coupled to the low-potential node GND. Further, a gate of the P-type transistor Tp1 and a gate of the N-type transistor Tn1 are electrically coupled to each other. The node N1 coupled to an output of the oscillation circuit 10 is electrically coupled to the gate of the P-type transistor Tp1 and the gate of the N-type transistor Tn1, and is also electrically coupled to the node N2.

Further, between the power supply node VREG and the low-potential node GND, the P-type transistor Tp2 and the N-type transistor Tn2 are coupled in series so as to be arranged from the power supply node VREG toward the low-potential node GND, thereby constituting the second inverter In2. That is, a source of the P-type transistor Tp2 is coupled to the power supply node VREG, and a drain thereof is coupled to a drain of the N-type transistor Tn2. A node to which the drain of the P-type transistor Tp2 and the drain of the N-type transistor Tn2 are coupled is referred to as a node N3. The node N3 is an output node of the waveform conversion circuit 21. A source of the N-type transistor Tn2 is coupled to the low-potential node GND. Further, a gate of the P-type transistor Tp2 and a gate of the N-type transistor Tn2 are electrically coupled to each other, and are also electrically coupled to the node N2.

Between the node N3 and the low-potential node GND, the resistance element R3 and the capacitive element C1 are coupled in series so as to be arranged from the node N3 toward the low-potential node GND, thereby constituting a low-pass filter LPF1. A node N4 between the resistance element R3 and the capacitive element C1 is electrically coupled to an inverting input terminal of the differential amplifier A1.

Further, between the power supply node VREG and the low-potential node GND, the resistance elements R4 and R5 are coupled in series so as to be arranged from the power supply node VREG toward the low-potential node GND. A node N5 between the resistance elements R4 and R5 is electrically coupled to a non-inverting input terminal of the differential amplifier A1. Therefore, the resistance elements R4 and R5 constitute a resistance voltage-dividing circuit RD1 that generates a reference voltage by dividing the regulator voltage applied to the power supply node VREG. In the embodiment, resistance values of the resistance elements R4 and R5 are the same. Therefore, a voltage of the node N5 is biased to ½ of the voltage of the power supply node VREG.

The differential amplifier A1 is a circuit that receives a power supply from the power supply node VREG and performs differential amplification with a predetermined gain. One end of the resistance element R6 and one end of the capacitive element C2 are electrically coupled to the node N6 that is an output node of the differential amplifier A1. The other end of the resistance element R6 is electrically coupled to the node N1, and the other end of the capacitive element C2 is electrically coupled to the low-potential node GND.

In the waveform conversion circuit 21 having the above configuration, a predetermined bias is applied by the resistance elements R1 and R2 to the node N1 to which the oscillation signal OSCO output from the oscillation circuit 10 is input. The waveform shaping circuit 21a implemented by the first inverter In1 and the second inverter In2 is provided between the node N1 and the node N3. These inverters are CMOS inverters, output a low level when an input signal is equal to or larger than a threshold, and output a high level when the input signal is smaller than the threshold. Therefore, the first inverter In1 and the second inverter In2 function as a circuit that inverts an input signal and outputs the inverted input signal, and shapes a waveform into a rectangular wave.

The waveform shaping circuit 21a shapes the oscillation signal OSCO in two stages by the first inverter In1 and the second inverter In2. Therefore, the oscillation signal OSCO is inverted twice, and the oscillation signal OSCO is converted into the clock signal CKO having a rectangular wave.

As described above, the waveform shaping circuit 21a according to the embodiment shapes a waveform into a rectangular wave by the inverter. The inverter is a circuit in which an output level changes according to a comparison between an input signal and a threshold. Therefore, when a bias voltage of the node N1 changes, a period in which a signal output from the inverter is at a high level changes, and a ratio of a high-level period to a cycle of the oscillation signal (a sum of the high-level period and a low-level period), that is, a duty changes.

In the embodiment, a predetermined bias is applied to the node N1 by the resistance elements R1 and R2, and the bias is designed to have a desired duty. In the embodiment, the desired duty is 50% (high-level period=low-level period). When the oscillation signal OSCO is applied to a voltage of ½ of the voltage of the power supply node VREG, the duty is designed to be 50%. However, when there is a manufacturing variation in a threshold of each transistor provided in the first inverter In1 and the second inverter In2, or when the threshold fluctuates depending on a temperature, a bias of the node N1 obtained by the resistance elements R1 and R2 may become an inappropriate bias for obtaining the desired duty.

Therefore, in the embodiment, a configuration for feeding back an output of the node N3 to the node N1 to adjust the bias voltage is provided. Specifically, the low-pass filter LPF1 is coupled to the node N3. The low-pass filter LPF1 functions as a circuit that smoothes the clock signal CK1. In the embodiment, a frequency of the clock signal CK1 is, for example, several tens to hundreds of MHz. A cutoff frequency fc of the low-pass filter LPF1 is, for example, several MHz. Therefore, the low-pass filter LPF1 functions as a filter that outputs a voltage obtained by converting the clock signal CK1 into a substantially direct current to the node N4. Further, a voltage of the node N4, which is an output of the low-pass filter LPF1, has a voltage value depending on a period in which the clock signal CK1 is at the high level. Therefore, the voltage output from the low-pass filter LPF1 to the node N4 is a voltage corresponding to a duty of the clock signal CK1. Here, the voltage output to the node N4 is referred to as a detection voltage.

The differential amplifier A1 is a circuit that amplifies a difference between a voltage of the inverting input terminal and a voltage of the non-inverting input terminal and outputs the amplified difference. In the embodiment, the node N5 electrically coupled to the non-inverting input terminal has a constant voltage obtained by dividing the regulator voltage applied to the power supply node VREG by the resistance voltage-dividing circuit RD1. Therefore, when the constant voltage of the node N5 is referred to as the reference voltage, the differential amplifier A1 functions as a circuit that outputs a bias voltage based on a difference between the detection voltage and the reference voltage to the input node N1 of the waveform shaping circuit 21a via the resistance element R6.

Figure 3:
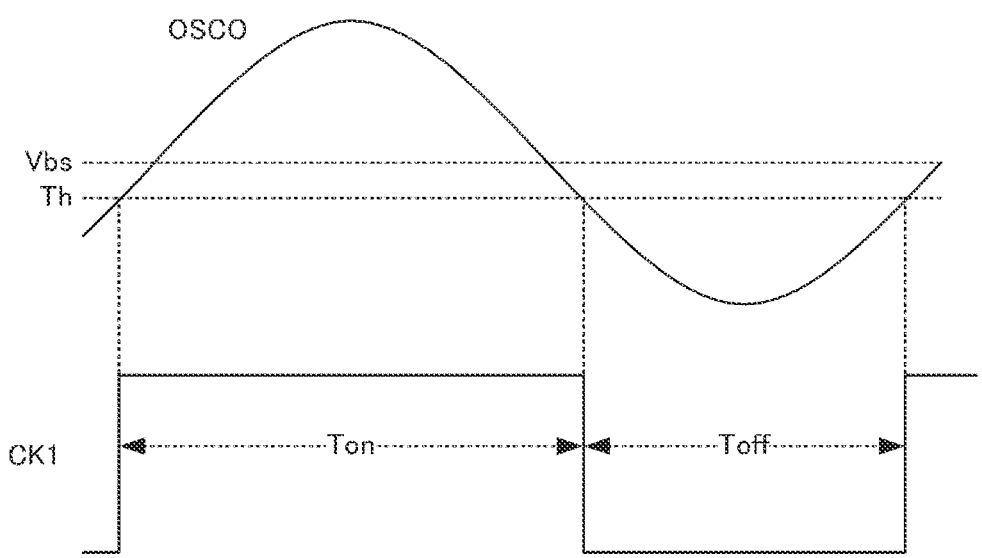
FIG. 3 is a graph showing a relationship among an oscillation signal, a threshold, a bias voltage, and a clock signal.

With the above configuration, in the embodiment, the bias voltage applied to the node N1 is adjusted according to the duty of the clock signal CK1 of the node N3. For example, as in the example shown in FIG. 3, when a threshold Th of the first inverter In1 and the second inverter In2 is lower than a bias voltage Vbs of the node N1, a period Ton in which a voltage of the oscillation signal OSCO is higher than the threshold is longer than a period Toff in which the voltage of the oscillation signal OSCO is lower than the threshold. As a result, a high-level period of the clock signal CK1 is longer than 50%.

Since the longer the high-level period is, the larger voltage the low-pass filter LPF1 outputs, the detection voltage output to the node N4 is higher than the reference voltage of the node N5. Therefore, in the differential amplifier A1, a detection voltage input to the inverting input terminal is higher than a reference voltage input to the non-inverting input terminal. As a result, in the differential amplifier A1, amplification is performed so as to lower a voltage of the node N6, and the bias voltage Vbs of the node N1 decreases and approaches the threshold Th of the first inverter In1 and the second inverter In2.

In the embodiment, the duty is adjusted to a desired value by the feedback as described above. In the configuration, as shown in FIG. 2, there is no low-pass filter as in JP-A-5-252007 between the oscillation circuit 10 and the waveform shaping circuit 21a. When there is the low-pass filter as in JP-A-5-252007 between an output of the oscillation circuit 10 and the first inverter In1, a thermal noise (noise floor) of a signal input to the waveform shaping circuit 21a may be increased. However, in the embodiment, since such a low-pass filter is not used, the thermal noise (noise floor) of the signal input to the waveform shaping circuit 21a is not increased.

On the other hand, in the circuit including a feedback loop that includes the differential amplifier A1 as in the embodiment, measures against abnormal oscillation are required. In the embodiment shown in FIG. 2, a delay in a phase occurs mainly due to the low-pass filter LPF1 and the differential amplifier A1 in a process of the feedback. Therefore, when the phase deviates about 180° in the process of the feedback and there is a frequency having a significant gain, oscillation may occur.

Figure 4:
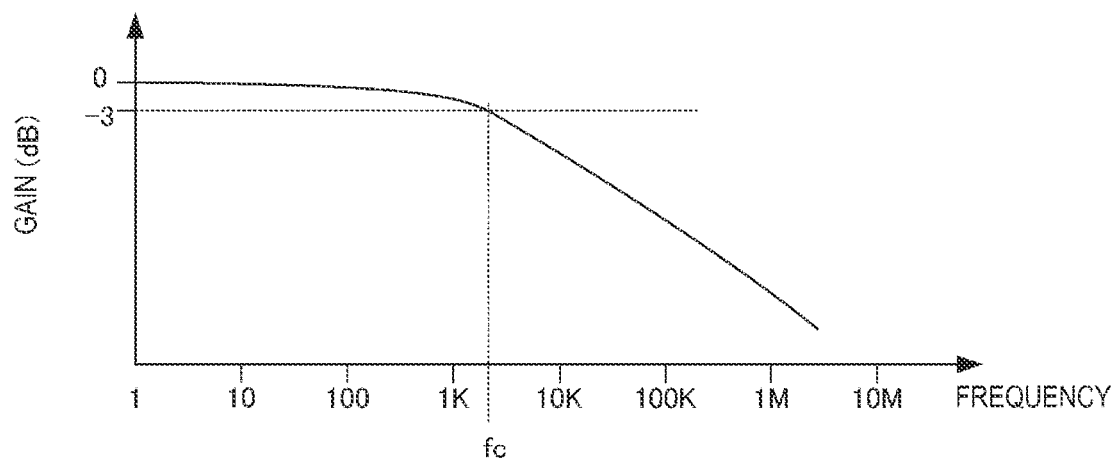
FIG. 4 is a graph showing frequency characteristics of a gain of a low-pass filter.
Figure 5:
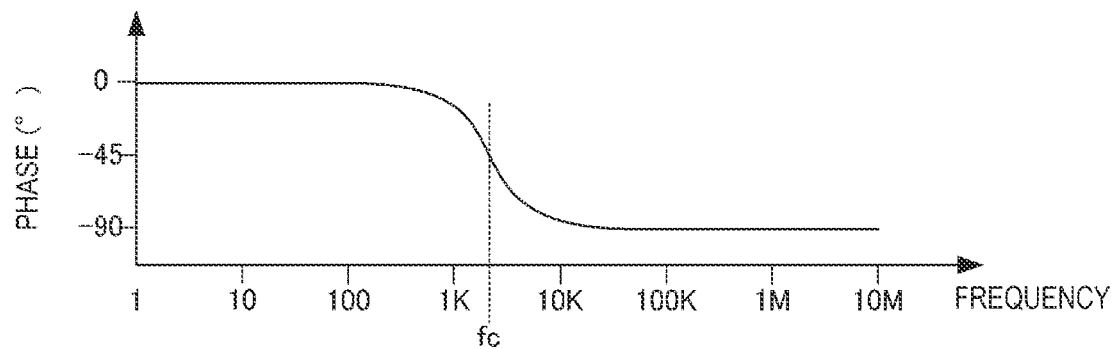
FIG. 5 is a graph showing frequency characteristics of a phase of the low-pass filter.
Figure 6:
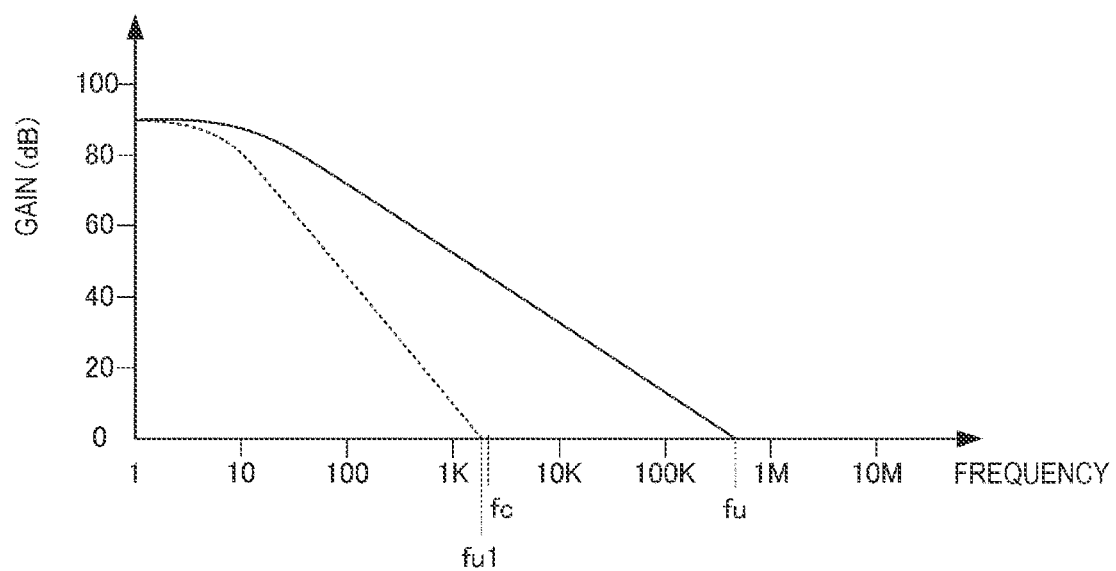
FIG. 6 is a graph showing frequency characteristics of a gain of a differential amplifier.
Figure 7:
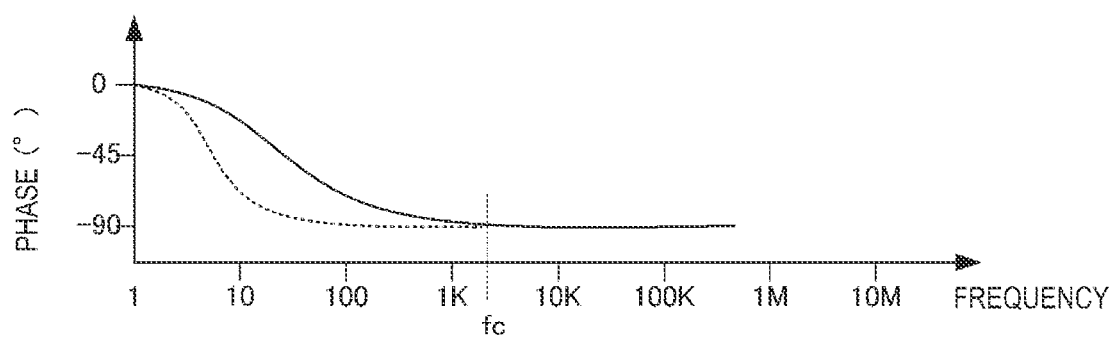
FIG. 7 is a graph showing frequency characteristics of a phase of the differential amplifier.

FIG. 4 is a graph showing frequency characteristics of a gain of the low-pass filter LPF1. FIG. 5 is a graph showing frequency characteristics of a phase of the low-pass filter LPF1. FIG. 6 is a graph showing frequency characteristics of a gain of the differential amplifier A1. FIG. 7 is a graph showing frequency characteristics of a phase of the differential amplifier A1. These graphs are graphs for qualitatively describing the frequency characteristics. Of course, since the frequency characteristics change according to a resistance value or a capacitance value of an element, the characteristics on the graph may vary according to a combination of elements.

In the low-pass filter LPF1, a gain is 0 dB in a band in which a frequency is low as in the example shown in FIG. 4. However, the gain decreases when the frequency increases, and the gain significantly decreases when the frequency is higher than the cutoff frequency fc at which the gain is −3 dB. Further, in the low-pass filter LPF1, there is no phase delay in a band in which a frequency is low as in the example shown in FIG. 5. However, the phase delay gradually occurs as the frequency increases. The phase is typically delayed by about 45° at the cutoff frequency fc, and the phase delay of 90° may finally occur when the frequency further increases.

On the other hand, in the differential amplifier A1, as in the example indicated by a solid line in FIG. 6, typically, an open loop DC gain at a frequency of 1 Hz has a maximum value, and the gain has a substantially maximum value in a band in which a frequency is low, but the gain decreases when the frequency increases. Further, in the differential amplifier A1, as in the example indicated by a solid line in FIG. 7, the phase is delayed while the frequency increases, and the phase delay of 90° may finally occur.

Since the low-pass filter LPF1 and the differential amplifier A1 typically have the frequency characteristics as described above, when there are the low-pass filter LPF1 and the differential amplifier A1 in a feedback loop, the phase delay may be about 180° in a specific frequency band. Therefore, when the gain of the differential amplifier A1 is larger than 0 dB in the specific frequency band, abnormal oscillation is caused.

Therefore, in the embodiment, a unity gain frequency fu of the differential amplifier A1 is configured to be lower than the cutoff frequency fc of the low-pass filter LPF1. Here, the unity gain frequency fu is a frequency at which the gain is 0 dB as shown in FIG. 6. Therefore, the abnormal oscillation does not occur at a frequency higher than the unity gain frequency fu. FIGS. 6 and 7 show, by a broken line, an example of the frequency characteristics of the differential amplifier A1 in which a unity gain frequency fu1 is lower than the cutoff frequency fc of the low-pass filter LPF1.

A delay of the low-pass filter LPF1 at the cutoff frequency fc is typically about 45° as shown in FIG. 5. Therefore, when the differential amplifier A1 having frequency characteristics indicated by a broken line in FIG. 6 is used, a gain of the differential amplifier A1 reaches 0 dB before a phase delay between the low-pass filter LPF1 and the differential amplifier A1 is 180° in total. Therefore, in the embodiment configured such that the unity gain frequency fu of the differential amplifier A1 is lower than the cutoff frequency fc of the low-pass filter LPF1, no abnormal oscillation occurs.

It is sufficient that the unity gain frequency fu of the differential amplifier A1 is lower than the cutoff frequency fc of the low-pass filter LPF1, but the greater the difference between the unity gain frequency fu and the cutoff frequency fc, the more the possibility of the abnormal oscillation can be reduced. Therefore, when the unity gain frequency fu of the differential amplifier A1 is set to be equal to or lower than half of the cutoff frequency fc of the low-pass filter LPF1, the possibility of the abnormal oscillation can be more reliably reduced.

Further, when the unity gain frequency fu of the differential amplifier A1 is set to be equal to or lower than 1/10 of the cutoff frequency fc of the low-pass filter LPF1, the possibility of the abnormal oscillation can be further reliably reduced. Such a configuration can be implemented by, for example, using the differential amplifier A1 whose gain of the open loop DC is 60 dB or more, setting the resistance elements R1 to R6 to 50 kΩ, the capacitive element C1 to 1 pF, the capacitive element C2 to 2 pF, a voltage of the power supply node VREG to about 1.5 V, and the clock signal CK1 to several tens to hundreds of MHz. In the configuration, for example, the cutoff frequency fc of the low-pass filter LPF1 is 3 MHz, and the unity gain frequency fu1 is 300 kHz. Therefore, the circuit can be implemented such that substantially no abnormal oscillation occurs.

The gain of the open loop DC of the differential amplifier A1 may be any value as long as a bias voltage according to threshold variations of the first inverter In1 and the second inverter In2 can be adjusted, and can be appropriately adjusted in the range. It has been confirmed by an applicant that when a gain that can adjust the bias voltage according to the threshold variations is used, even when thresholds of the first inverter In1 and the second inverter In2 vary, a variation of the duty is ±1% or less.

According to the embodiment, the duty can be adjusted to a desired value. When the desired duty is 50%, since a waveform of the clock signal CK1 is close to a symmetrical rectangular wave, even-number order harmonic components among harmonic components in the clock signal CK1 can be very effectively reduced.

Further, according to the embodiment, it is possible to prevent a variation of the duty of the clock signal CK1 according to the threshold variations of the first inverter In1 and the second inverter In2. Therefore, even when the threshold variations of the first inverter In1 and the second inverter In2 occur due to a temperature change, it is possible to perform adjustment such that the clock signal CK1 has a desired duty. Therefore, it is possible to output the clock signal CK1 having the desired duty without generating the abnormal oscillation and unnecessary spurious signals in a wide temperature range, for example, a range of –40° C. to 125° C.

2. Second Embodiment

In the first embodiment described above, the resistance voltage-dividing circuit RD1 has a configuration in which voltage-dividing resistance according to the resistance ratio of the resistance elements R4 and R5 is applied to the node N5, but other configurations may be used. For example, a value of the reference voltage applied to the non-inverting input terminal of the differential amplifier A1 may be adjustable.

Figure 8:
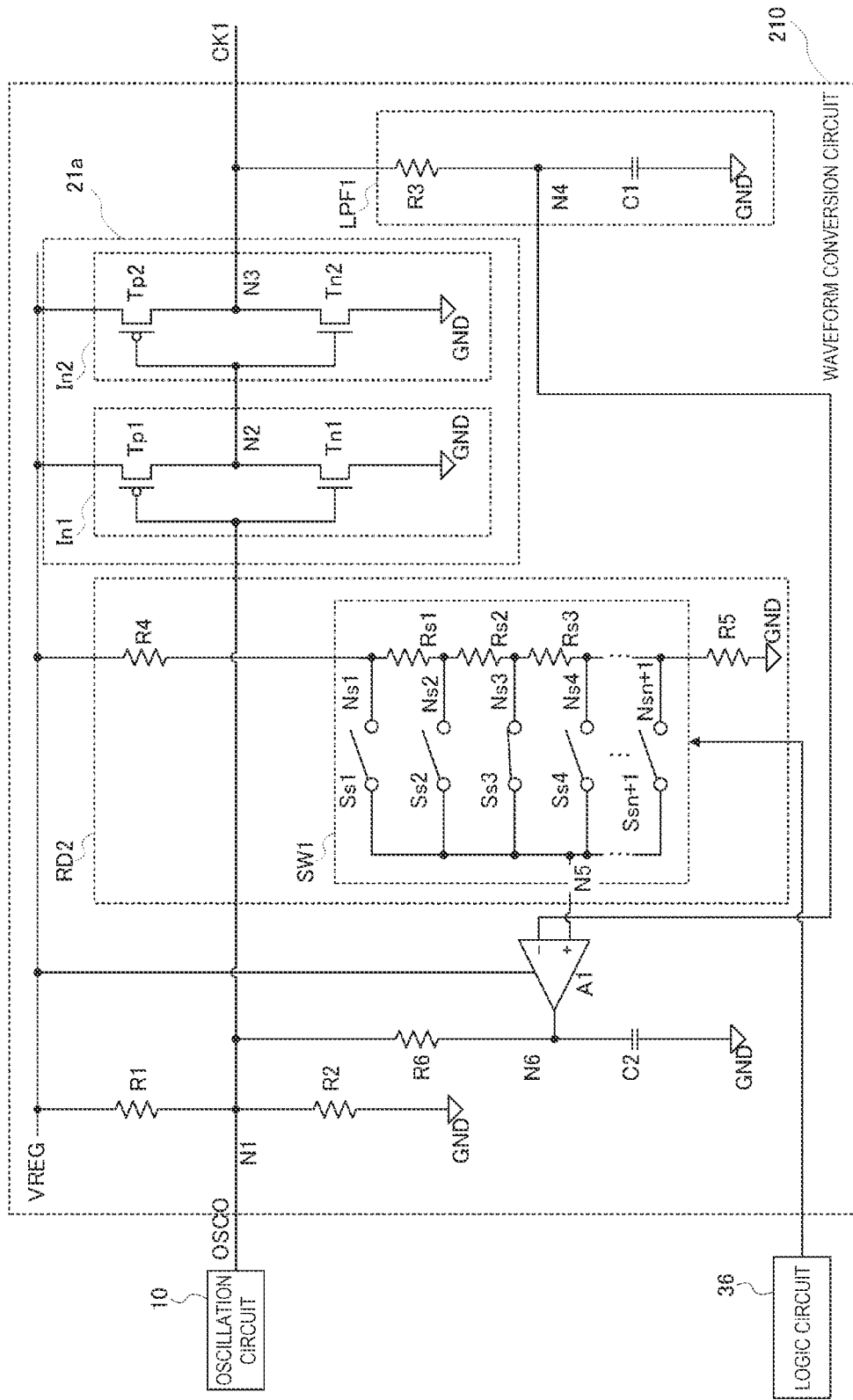
FIG. 8 is a circuit diagram of a waveform conversion circuit according to a second embodiment.

FIG. 8 is a circuit diagram of a waveform conversion circuit 210 according to a second embodiment in which the resistance voltage-dividing circuit RD1 in the first embodiment is replaced with a resistance voltage-dividing circuit RD2. In FIG. 8, configurations similar to those of FIG. 2 are denoted by similar reference numerals. In the resistance voltage-dividing circuit RD2 provided in the waveform conversion circuit 210, similar to the resistance voltage-dividing circuit RD1, the resistance elements R4 and R5 are coupled to each other between the power supply node VREG and the low-potential node GND. That is, one end of the resistance element R4 is electrically coupled to the power supply node VREG, and one end of the resistance element R5 is electrically coupled to the low-potential node GND.

In the resistance voltage-dividing circuit RD2, a switch circuit SW1 is provided between the resistance elements R4 and R5. The switch circuit SW1 is a circuit that selects any one of a plurality of resistance elements coupled in series and nodes between the plurality of resistance elements and outputs a reference voltage. Specifically, the switch circuit SW1 includes a plurality of resistance elements Rs1, Rs2, Rs3, ..., Rsn (n is a natural number. Rsn is not illustrated in FIG. 8.). These resistance elements Rs1 to Rsn are coupled in series. One end of the resistance element Rs1 is electrically coupled to the resistance element R4, and one end of the resistance element Rsn is electrically coupled to the resistance element R5.

Ends of switches Ss1 to Ssn are electrically coupled to nodes at end portions of the resistance elements Rs1 to Rsn, and the other ends of the switches Ss1 to Ssn are electrically coupled to the node N5. For example, a node Ns1 between the resistance element R4 and the resistance element Rs1 is electrically coupled to one end of the switch Ss1, and a node Ns2 between the resistance element Rs1 and the resistance element Rs2 is electrically coupled to one end of the switch Ss2.

In the switch circuit SW1, on and off of the switches Ss1 to Ssn are controlled by the logic circuit 36. That is, in the external communication mode described above, switch control data indicating a switch to be turned on is stored from an external device in the storage circuit 50. When an operation in the normal operation mode is started in a state where the switch control data is stored in the storage circuit 50, the logic circuit 36 turns on the switch indicated by the switch control data, and turns off the other switches. According to the configuration, a user can adjust a voltage-dividing ratio of the resistance voltage-dividing circuit RD2 by using the external device.

FIG. 8 shows a state where the switch Ss3 is turned on. In the state, a voltage of the node N5 has a value obtained by dividing the regulator voltage by a ratio of a sum of resistance values of the resistance elements R4, Rs1, and Rs2 to a sum of resistance values of the resistance elements Rs3, ..., Rsn+R5. In the example shown in FIG. 8, resistance values of the resistance elements R4 and R5 are also the same. Further, resistance values of the resistance elements Rs1 to Rsn are smaller than resistance values of the resistance elements R4 and R5, for example, smaller by one digit or two digits or more. Therefore, by selecting the switches Ss1 to Ssn to be turned on according to the switch control data, the user can finely adjust the voltage-dividing ratio.

According to the configuration, the reference voltage that is the voltage of the node N5 can be finely adjusted so as to be lower or higher than 1/2 of a voltage of the power supply node VREG. A desired duty is generally 50%, but a circuit coupled to the T3 terminal that is an output terminal of the oscillator 1 may have characteristics for changing the duty. For example, when the clock signal CKO having a duty of 50% is input to the circuit coupled to the T3 terminal, it is assumed that the circuit has characteristics such that, for example, the high-level period is longer by 1% and the low-level period is shorter by 1%.

In this case, even when the clock signal CKO having the duty of 50% is input to the circuit coupled to the T3 terminal, the high-level period may be 51% and the low-level period may be 49% in the circuit. In such a case, in the circuit shown in FIG. 8, when the voltage-dividing ratio is finely adjusted, and the duty of the clock signal CKO is changed by about 1%, for example, setting is performed such that the high-level period is about 49% and the low-level period is about 51%, the duty in the circuit changes due to the characteristics of the circuit coupled to the T3 terminal and is close to 50%. As a result, in the circuit coupled to the T3 terminal of the oscillator 1, adjustment can be performed such that a desired duty is obtained.

Also in the second embodiment shown in FIG. 8, there is no low-pass filter as in JP-A-5-252007 between the oscillation circuit 10 and the waveform shaping circuit 21a. Therefore, an increase in thermal noise (noise floor) due to the low-pass filter is not caused. Further, in the second embodiment, the unity gain frequency fu of the differential amplifier A1 is also configured to be lower than the cutoff frequency fc of the low-pass filter LPF1. Therefore, abnormal oscillation caused by feedback between the node N3 and the node N1 does not occur. Further, the unity gain frequency fu of the differential amplifier A1 may be equal to or lower than half of the cutoff frequency fc of the low-pass filter LPF1, or may be equal to or lower than 1/10 of the cutoff frequency fc of the low-pass filter LPF1. With these configurations, effects similar to those of the first embodiment are obtained.

3. Third Embodiment

Figure 9:
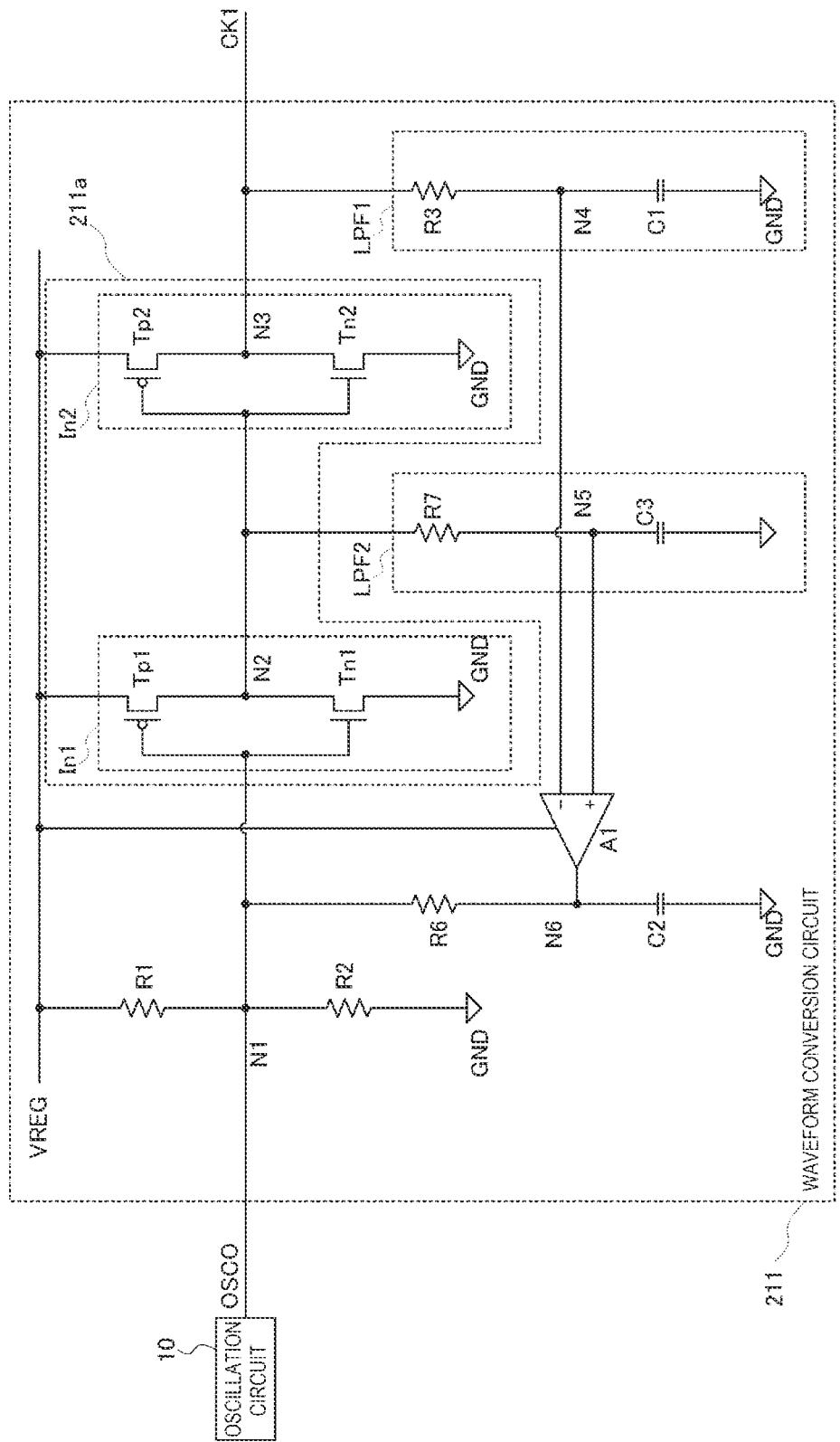
FIG. 9 is a circuit diagram of a waveform conversion circuit according to a third embodiment.

Further, the reference voltage is not limited to a voltage obtained by dividing the regulator voltage. FIG. 9 is a circuit diagram of a waveform conversion circuit 211 having a configuration in which the reference voltage is generated based on an output signal of the first inverter In1. In FIG. 9, configurations similar to those of FIG. 2 are denoted by similar reference numerals. The waveform conversion circuit 211 does not include the resistance voltage-dividing circuit RD1, but instead includes a low-pass filter LPF2.

The low-pass filter LPF2 includes a resistance element R7 and a capacitive element C3. The resistance element R7 and the capacitive element C3 are coupled in series so as to be arranged from the node N2 toward the low-potential node GND between the node N2 and the low-potential node GND. The node N5 between the resistance element R7 and the capacitive element C3 is electrically coupled to a non-inverting input terminal of the differential amplifier A1. In the low-pass filter LPF2, a resistance value of the resistance element R7 can be set to be the same as, for example, a resistance value of the resistance element R3. Further, a capacitance value of the capacitive element C3 can be set to be the same as, for example, a capacitance value of the capacitive element C1.

According to the above configuration, the reference voltage applied to the node N5 that is the non-inverting input terminal of the differential amplifier A1 is a voltage obtained by smoothing the output signal of the first inverter In1 by the low-pass filter LPF2. The node N2 that is an output node of the first inverter In1 is an input node of the second inverter In2. A signal of the node N2 is input to the low-pass filter LPF2, and a signal of the node N3 that is an output node of the second inverter In2 is input to the low-pass filter LPF1.

Therefore, clock signals having mutually opposite phases are input to the low-pass filter LPF2 and the low-pass filter LPF1. Therefore, when a high-level period is longer than a low-level period in a clock signal of the node N2 input to the low-pass filter LPF2, the low-level period is longer than the high-level period in a clock signal of the node N3 input to the low-pass filter LPF1. That is, when a duty of the clock signal of the node N2 is small, a duty of the clock signal of the node N3 is large. Further, when the duty of the clock signal of the node N2 is large, the duty of the clock signal of the node N3 is small.

The low-pass filters LPF2 and LPF1 smooth the input clock signals. Therefore, the low-pass filter LPF2 outputs a voltage corresponding to the duty of the clock signal of the node N2, and the low-pass filter LPF1 outputs a voltage corresponding to the duty of the clock signal of the node N3. Therefore, when an output voltage of the low-pass filter LPF1 is set as the detection voltage, an output voltage of the low-pass filter LPF2 is set as the reference voltage, and the detection voltage and the reference voltage are input to the differential amplifier A1, it is possible to output a bias voltage for eliminating a difference between both voltages from the differential amplifier A1.

In the second embodiment shown in FIG. 9, there is also no low-pass filter as in JP-A-5-252007 between the oscillation circuit 10 and a waveform shaping circuit 211a. Therefore, an increase in thermal noise (noise floor) due to the low-pass filter is not caused. Further, in the third embodiment, the unity gain frequency fu of the differential amplifier A1 is also configured to be lower than the cutoff frequency fc of the low-pass filter LPF1. Therefore, abnormal oscillation caused by feedback between the node N3 and the node N1 does not occur. Further, the unity gain frequency fu of the differential amplifier A1 may be equal to or lower than half of the cutoff frequency fc of the low-pass filter LPF1, or may be equal to or lower than 1/10 of the cutoff frequency fc of the low-pass filter LPF1. With these configurations, effects similar to those of the first embodiment are obtained.

4. Other Embodiments

The embodiments described above are examples of carrying out the present disclosure, and various other embodiments can be adopted. For example, a configuration in which the temperature sensor 30, the temperature compensation circuit 32, and the frequency control circuit 34 are omitted may be used. Further, in the output circuit 20, the pre-buffers 23 and 25 and the output buffers 24 and 26 are provided, and the CMOS output waveform and the clipped sine waveform can be selected, but a configuration that can output only one of the waveforms may be used, or the other waveform can be output. Further, an application target of the oscillator 1 is not limited, and the oscillator 1 can be used for various targets, for example, various electronic devices and electrical components of a vehicle.

The oscillation circuit only needs to be able to generate an oscillation signal, and only needs to be able to amplify an output signal of the resonator and feed back the amplified output signal to the resonator. The method is not limited, and for example, various types of oscillation circuits such as a pierce oscillation circuit, an inverter type oscillation circuit, a Colpitts oscillation circuit, and a Hartley oscillation circuit may be used. The waveform shaping circuit only needs to be able to shape the oscillation signal into a rectangular wave, and the method is not limited. For example, a circuit using a comparator may be used.

The low-pass filter only needs to be able to smooth a clock signal, and generate a detection voltage corresponding to a duty of the clock signal. Therefore, an element that constitutes the low-pass filter is not limited to the element as described above, and the low-pass filter may be implemented by a combination of various elements.

The differential amplifier is a circuit that outputs a bias voltage based on a difference between the detection voltage and the reference voltage to an input node of the waveform shaping circuit, and may be configured such that the unity gain frequency of the differential amplifier is lower than the cutoff frequency of the low-pass filter. The elements that constitute the differential amplifier may also be implemented by various combinations.

What is claimed is:

1. A circuit device comprising:
    an oscillation circuit configured to generate an oscillation signal;
    a waveform shaping circuit configured to receive the oscillation signal to shape the oscillation signal into a clock signal having a rectangular wave;
    a low-pass filter configured to receive the clock signal from the waveform shaping circuit to smooth the clock signal and generate a detection voltage corresponding to a duty of the clock signal; and
    a differential amplifier configured to receive the detection voltage from the low-pass filter and output a bias voltage based on a difference between the detection voltage and a reference voltage to an input node of the waveform shaping circuit, wherein
    a unity gain frequency of the differential amplifier is lower than a cutoff frequency of the low-pass filter.

2. The circuit device according to claim 1, wherein
    the unity gain frequency of the differential amplifier is equal to or lower than half of the cutoff frequency of the low-pass filter.

3. The circuit device according to claim 1, wherein
    the unity gain frequency of the differential amplifier is equal to or lower than $1/10$ of the cutoff frequency of the low-pass filter.

4. The circuit device according to claim 1, further comprising:
    a resistance voltage-dividing circuit configured to divide a regulator voltage and generate the reference voltage.

5. The circuit device according to claim 4, wherein
    the resistance voltage-dividing circuit includes a plurality of resistance elements coupled in series and a switch circuit configured to select one of nodes between the plurality of resistance elements and output the reference voltage.

6. The circuit device according to claim 1, wherein
    the waveform shaping circuit includes a first inverter to which the oscillation signal is input, and a second inverter configured to invert an output signal of the first inverter to generate the clock signal, and
    the reference voltage is generated by smoothing the output signal of the first inverter.

7. The circuit device according to claim 1, wherein
    no low-pass filter is provided between the oscillation circuit and the waveform shaping circuit.

8. An oscillator comprising:
    the circuit device according to claim 1; and
    a resonator, wherein
    the oscillation circuit causes the resonator to oscillate to generate the oscillation signal.

* * * * *